United States Patent
Hwang

(10) Patent No.: US 7,560,374 B2
(45) Date of Patent: Jul. 14, 2009

(54) MOLD FOR FORMING CONDUCTIVE BUMP, METHOD OF FABRICATING THE MOLD, AND METHOD OF FORMING BUMP ON WAFER USING THE MOLD

(75) Inventor: Tae-Joo Hwang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 47 days.

(21) Appl. No.: 11/763,258

(22) Filed: Jun. 14, 2007

(65) Prior Publication Data

US 2007/0290367 A1     Dec. 20, 2007

(30) Foreign Application Priority Data

Jun. 19, 2006   (KR)  ...................... 10-2006-0054923

(51) Int. Cl.
*H01L 21/44* (2006.01)
(52) U.S. Cl. ...................... 438/615; 438/612; 438/613; 438/FOR. 343
(58) Field of Classification Search ................ 438/612, 438/613, 615, FOR. 343
See application file for complete search history.

(56) References Cited

FOREIGN PATENT DOCUMENTS

| JP | 08-340001 | 12/1996 |
|---|---|---|
| JP | 09-223697 | 8/1997 |
| JP | 2001-135667 | 5/2001 |

OTHER PUBLICATIONS

English language abstract of Japanese Publication No. 08-340001.
English language abstract of Japanese Publication No. 09-223697.
English language abstract of Japanese Publication No. 2001-135667.

*Primary Examiner*—Thanh V Pham
(74) *Attorney, Agent, or Firm*—Marger Johnson & McCollom, P.C.

(57) ABSTRACT

A mold for forming a conductive bump, a method of fabricating the mold, and a method of forming a bump on a wafer using the mold are provided. The bump can be formed by employing various materials, the mold can be repeatedly used several times because the mold is not damaged, and due to a high precision, the pitch of the bumps is not limited. The mold for forming a conductive bump comprises a first substrate having a groove to form a bump; a second substrate for vacuum adsorption formed below the first substrate, and having a through-hole in communication with the groove; and a mask layer formed on the first substrate, and used to form the groove.

19 Claims, 7 Drawing Sheets

MOLD FOR FORMING CONDUCTIVE BUMP, METHOD OF FABRICATING THE MOLD, AND METHOD OF FORMING BUMP ON WAFER USING THE MOLD

CROSS-REFERENCE TO RELATED PATENT APPLICATION

This application claims priority from Korean Patent Application No. 10-2006-0054923, filed on Jun. 19, 2006, in the Korean Intellectual Property Office, the disclosure of which is incorporated herein in its entirety by reference.

BACKGROUND

1. Technical Field

The present invention relates to a semiconductor device and a method of fabricating the same, and more particularly, to a mold for forming a conductive bump used in connecting interconnections of a semiconductor device, a method of fabricating the mold, and a method of forming a bump on a semiconductor wafer using the mold.

2. Description of the Related Art

Micro devices such as a semiconductor device or a micro electro mechanical system (MEMS) normally use a wire bonding method, a taped automated bonding (TAB) method, a flip chip method or the like in order to electrically connect chips to an external substrate such as a printed circuit board (PCB).

The flip chip method has advantages over the other methods in that speed and power ratings of a device can be improved and the number of pads per unit area can be increased, since an electron pathway is short. Because of these advantages, the flip chip method is currently often used in electronic products requiring excellent electrical characteristics, for example, super computers, portable electronic products, and the like.

In the flip chip method, it is necessary to form a conductive bump such as a solder bump on a semiconductor wafer in order to adequately bond a chip and an external substrate. Technology for fabricating solder bumps has been developed to fabricate solder bumps having good conductivity, uniform height and a fine pitch. In the bump fabrication technology used in the flip chip method, the properties and the application ranges of the solder bumps depend on the material forming the bumps. Typical bump fabrication technology includes a solder ball placement method in which a solder ball is directly placed on a wafer, or an electroplating method, an evaporation method, and a stencil printing method, in which a solder bump is formed by reflow after intermediate formation processes. For example, in the stencil printing method, the intermediate formation process includes stencil printing solder paste on to the wafer.

The solder ball placement method includes placing preformed solder balls of substantially uniform dimensions on the wafer. An advantage of the solder ball placement method is that the uniformity of the heights of the solder bumps, after reflow, can be easily controlled, but drawbacks are that manufacturing speed is significantly low compared to that of the electroplating or stencil printing method, and the distance between bumps must be very wide to accommodate the solder ball placement equipment. When the electroplating method or the evaporation method is used, the types of component elements that form the solder bump are limited. That is, the solder bumps are difficult to fabricate when three metal elements or more are used in the electroplating method or the evaporation method. It is desirable to use multiple elements in the solder bump to achieve desired performance characteristics or to meet industry standards, such as environmental compliance. Further, since high-cost processes such as a photolithography process must be performed, fabrication costs increase.

The stencil printing method has an advantage that the bump fabrication facilities are relatively simple and low-priced, but it is limited in that the quality of the bump formed on a wafer depends on the physical properties of the printed solder paste, specifically, the mixture of solder powder and flux, and the fabrication capabilities of the stencil. In particular, as the size of a wafer increases, the integration density of semiconductor chips increases, and the number of pins increases, the stencil printing method becomes more limited in its ability to accomplish a required fine pitch and achieve coplanarity of the heights of the reflowed solder bumps.

Further, methods containing intermediate formation processes also have drawbacks in that continuous use may be limited because a substrate where a solder bump is formed may be damaged or worn by cleaning or by the pressure applied during the transfer of the solder bump to a semiconductor wafer.

The invention addresses these and other disadvantages of the conventional methods.

SUMMARY

Some embodiments of the present invention provide a mold for forming a conductive bump, a method of fabricating the mold, and a method of forming a bump on a wafer using the mold. Some embodiments of the present invention enable the bump to be formed by employing various materials, the mold to be repeatedly used several times because the mold is not damaged in the method, and due to a high precision of the mold, the bump pitch is not limited.

According to one embodiment of the present invention, there is provided a mold for forming a conductive bump comprising: a first substrate having a groove; a second substrate disposed below the first substrate, and having a through-hole in communication with the groove; and a mask layer formed on the first substrate, and having an opening exposing the groove.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1A:
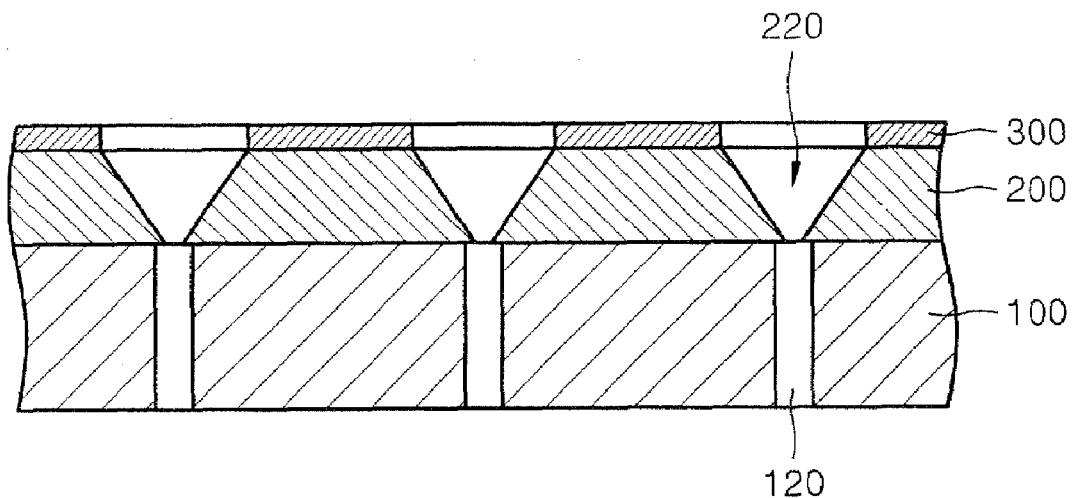
FIG. 1A is a sectional view illustrating a mold for forming a conductive bump according to a first embodiment of the present invention.

The present invention will now be described more fully hereinafter with reference to the accompanying drawings, in which preferred embodiments of the invention are shown. When it is described that one layer is positioned 'on' another layer or substrate, the layer can be directly formed on another layer or substrate, or a third layer can be positioned between the two. In addition, the thicknesses of layers and regions in the drawings are exaggerated for clarity, and like reference numbers refer to like elements throughout the specification. The terms in this specification are used for the purpose of explaining the present invention, but they are not intended to limit the meanings of the terms or limit the scope of the present invention as defined in the claims.

FIG. 1A is a cross-sectional view illustrating a mold for forming a conductive bump according to a first embodiment of the present invention.

Referring to FIG. 1A, a mold for forming a conductive bump according to an embodiment of the present invention includes a first substrate 200 having a plurality of grooves 220, a second substrate 100 formed below the first substrate and having through-holes 120 respectively in communication with the bottoms of the grooves 220, and a mask layer 300 with a pattern on the first substrate 200. The plurality of grooves may have, for example, a substantially funnel-shape, among other shapes as discussed below.

The mold for forming a conductive bump according to an embodiment of the present invention may have a three-layered structure including the first and second substrates 200 and 100, and the mask layer 300. However, the present invention is not limited to the three-layered structure, but the mold may have a structure with a greater number of layers, if necessary.

The first substrate 200 may be formed by etching (e.g., wet etching) a silicon substrate having a crystallographic orientation [100]. The funnel-shaped groves can be formed in the silicon substrate as illustrated in FIG. 1A. The funnel-shaped groove is used to form the conductive bump. Due to the small contact area of the funnel-shaped groove with the bump, it is advantageous for forming a ball-shaped bump and for transferring a bump to a semiconductor wafer. When the diameter of the bump formed through the groove 220 of the first substrate 200 is 100 μm, the thickness of the first substrate 200 may be 100 μm.

The first substrate 200 is not limited to the silicon substrate having a crystallographic orientation [100], and a silicon substrate having a crystallographic orientation other than [100] or other substrates composed of different materials may be used. When the different material substrate is used, a dry etch process or both wet etch and dry etch processes are performed to form the funnel-shaped grooves. Further, the shape of the groove is not limited to the funnel shape, and the groove can be formed with various shapes such as a cylinder or a right prism.

The second substrate 100 may be formed of a photosensitive glass, and the through-hole 120 may be formed using a photolithography process to be in communication with the groove. In particular, the through-hole 120 may be coupled to the bottom of the funnel-shaped groove 220, and is used as a vacuum adsorption path to form a conductive bump during a subsequent process, or to maintain the conductive bump in the groove during processing. When the bump formed in the groove 220 of the first substrate 200 has a diameter of 100 μm, the diameter of the through-hole may be 10 to 50 μm in order to effectively accomplish vacuum adsorption. The second substrate 100 may have a thickness of about 500 μm or greater in order to prevent breakage or damage and maintain the whole mold shape, but it is not limited to this thickness.

The second substrate 100 is not limited to the photosensitive glass substrate, and it may be composed of another material as long as the through-hole can be appropriately formed in the second substrate 100.

The mask layer 300 may comprise silicon oxide or silicon nitride, but it is not limited thereto. A pattern is formed in the mask layer 300, and an opening of the pattern is connected to the upper portion of the groove 220 of the first substrate 200. In other words, the mask layer 300 has an opening that exposes the groove 220. The groove 220 of the first substrate 200 is formed by performing a wet etch or dry etch process using the mask layer 300 as a mask. The opening of the pattern of the mask layer 300 is formed to coincide or correspond with a pad portion of a semiconductor wafer where a bump will be subsequently attached.

Figure 1B:
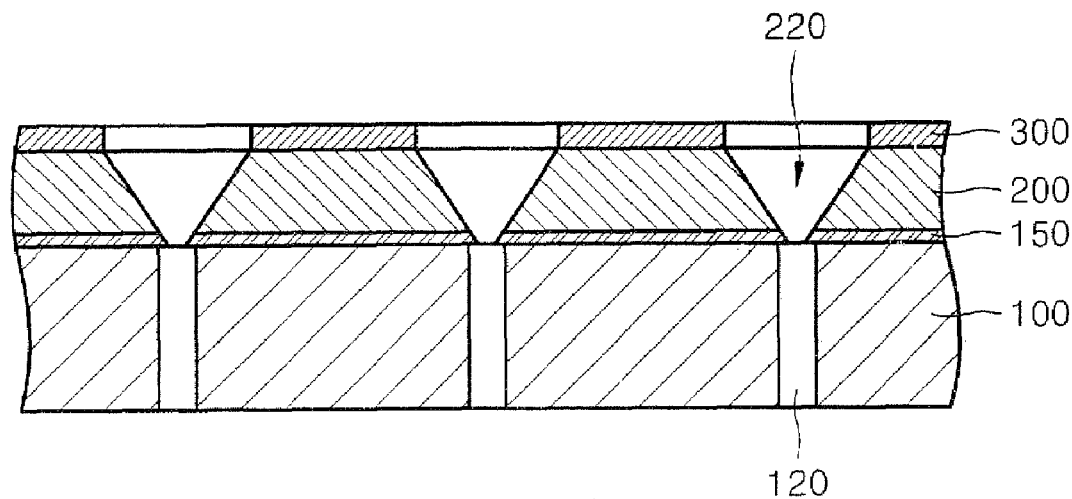
FIG. 1B is a sectional view illustrating a mold for forming a conductive bump according to a second embodiment of the present invention.

FIG. 1B is a sectional view illustrating a mold for forming a conductive bump according to a second embodiment of the present invention.

Referring to FIG. 1B, the mold for forming a conductive bump according to the second embodiment is similar to the mold for forming a conductive bump in the embodiment of FIG. 1A, but an adhesive layer 150 is formed between a first substrate 200 and a second substrate 100 to bond the first and second substrates 200, 100. Thus, since the mold for forming a conductive bump according to this embodiment further comprises the adhesive layer 150, it has a four-layered structure unlike the embodiment of FIG. 1A. However, the mold for forming a conductive bump according to this embodiment may have a structure having a greater number of layers, if necessary.

The first substrate 200 and the second substrate 100 may be attached to each other using various bonding methods. For example, an anodic bonding method applying a high voltage at an appropriate temperature, or a bonding method applying a thermal compression may be used.

In the second embodiment of the present invention, illustrated in FIG. 1B, since the adhesive layer 150 is formed between the first substrate 200 and the second substrate 100 so as to bond the two substrates, the difference between the thermal expansion rates of the first and second substrates is relieved, thereby preventing deformation or warpage of the first and second substrates. In other words, the adhesive layer 150 may function as a buffer layer between the first substrate 200 and the second substrate 100.

Figure 1C:
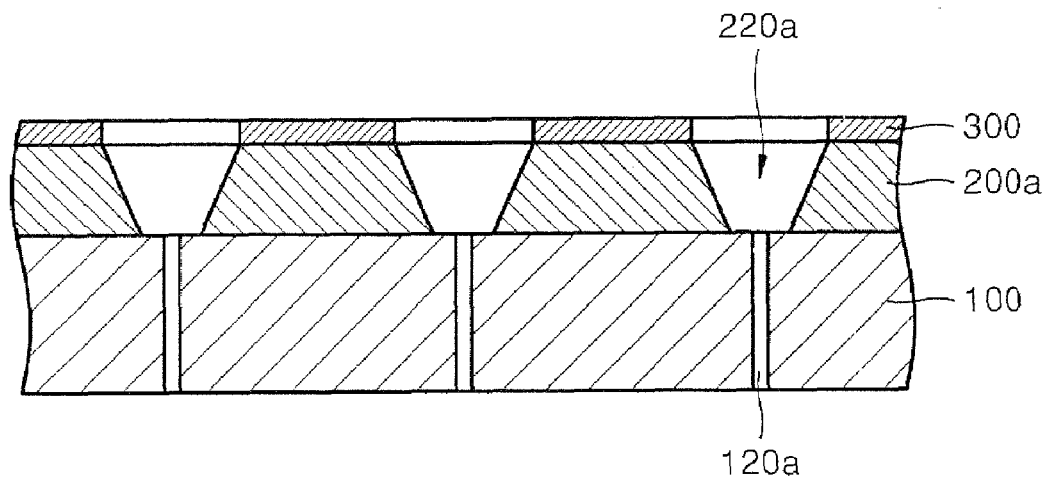
FIG. 1C is a sectional view illustrating a mold for forming a conductive bump according to a third embodiment of the present invention.

FIG. 1C is a sectional view illustrating a mold for forming a conductive bump according to a third embodiment of the present invention. The mold for forming a conductive bump according to this embodiment includes a first substrate 200a having a groove 220a different from the groove 220 formed in the first substrate 200 according to the embodiment illustrated in FIG. 1A.

As illustrated in FIG. 1C, when the groove 220a is formed with a substantially trapezoidal cross-section, a through-hole 120a of a second substrate 100 is preferably formed with a minimum size capable of allowing vacuum adsorption, and capable of minimizing the discharge of conductive powder from the groove 220a during formation of the conductive bump, as described below.

The third embodiment, illustrated in FIG. 1C, is an example of a groove having a shape that is different from the funnel-shaped groove formed in the first substrate in the embodiment shown in FIG. 1A, but the groove of the embodiment of FIG. 1C is not limited to this shape, and various shapes of grooves can be provided.

The mold for forming a conductive bump according to embodiments of the present invention has a structure including three layers or more, and solves the problems raised in the methods of forming a bump by, for example, electroplating, evaporation, and printing. Therefore, a conductive bump can be more easily formed, and bonding of the bump to a semiconductor wafer can be more easily accomplished. The conductive bump will be further explained below in the method of forming a bump on a semiconductor wafer.

FIGS. 2A through 2D are cross-sectional views illustrating a method of fabricating a mold for forming a conductive bump according to an embodiment of the present invention.

Figure 2A:
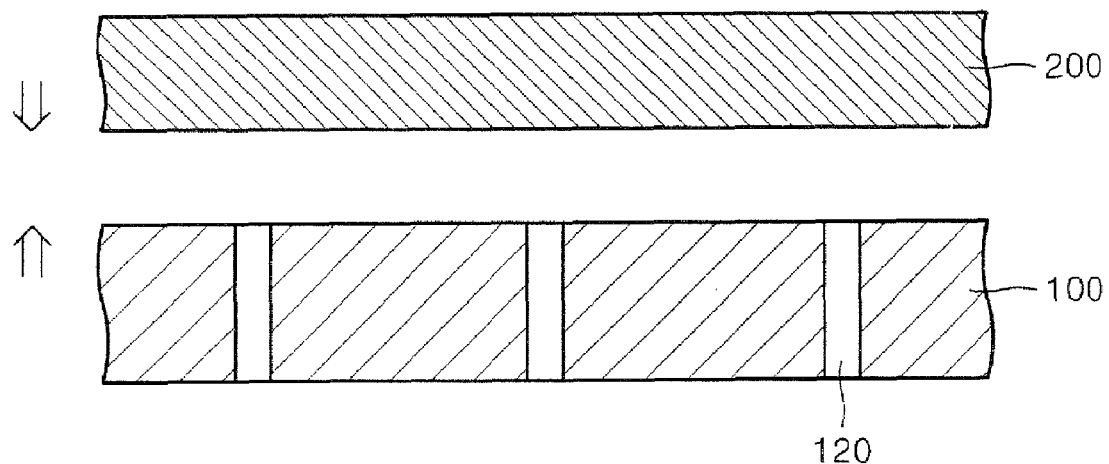
FIGS. 2A through 2D are sectional views illustrating a method of fabricating a mold for forming a conductive bump according to an embodiment of the present invention.

Referring to FIG. 2A, a first substrate 200 formed of a silicon substrate having crystallographic orientation [100] is attached to a second substrate 100 having through holes 120. The second substrate 100 may be a photosensitive glass substrate as described above, and the through-holes 120 may be formed using a photolithography process.

The first substrate 200 is not limited to the silicon substrate having crystallographic orientation [100], and the second substrate 100 is not limited to the photosensitive glass substrate. For example, the first substrate 200 may be formed of another semiconductor material. Depending on the application, the first substrate 200 may have a crystallographic orientation other than [100]. The bonding of the first and second substrates 200, 100 may be performed using an anodic bonding method, a thermal compression method, or other bonding techniques. Alternatively, an adhesive layer may be formed on the second substrate 100, and the first substrate 200 may be bonded to the adhesive layer.

Figure 2B:
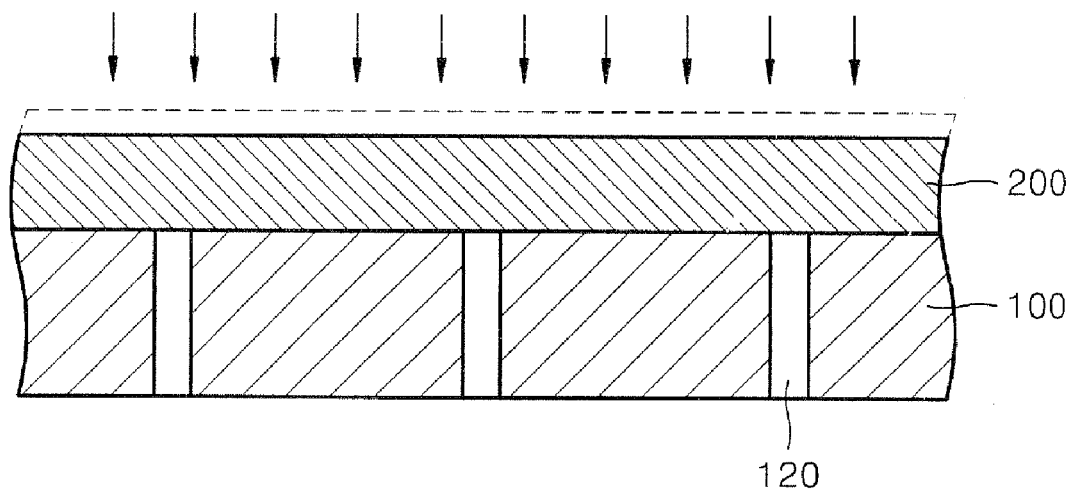

Referring to FIG. 2B, after the bonding process, the upper surface of the first substrate 200 is polished using a polishing process, for example, a back-lap process, to a predetermined thickness. The back-lap process may include one or more of a wafer grinding, wafer etching, and wafer polishing process. The predetermined thickness may be used to adjust the size of the conductive bump when it is formed, as described below. When the diameter of the conductive bump is 100 μm, the thickness of the first substrate 200 is preferably 100 μm after the polishing process. In other words, when a conductive bump of 100 μm diameter is desired, the predetermined thickness of the first substrate 200 may be 100 μm.

Figure 2C:
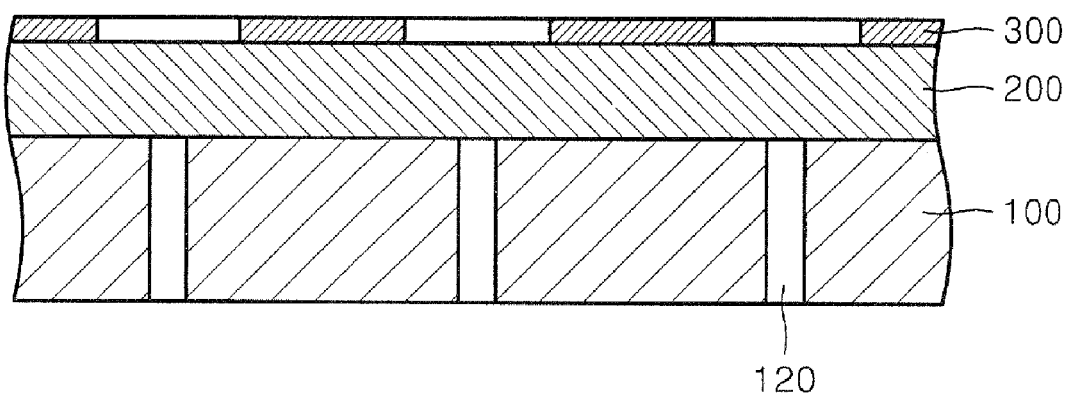

Referring to FIG. 2C, after the first substrate 200 is polished using a process such as a back-lap process, a mask layer 300 with a pattern is formed on the first substrate 200. The mask layer 300 is formed by depositing silicon oxide or silicon nitride to a predetermined thickness, and by performing a photolithography process, so as to form a predetermined pattern. Here, the opening of the pattern of the mask layer 300 is formed to coincide or correspond with a pad portion of a semiconductor wafer where a bump will be subsequently formed. As described above, the mask layer 300 is not limited to silicon oxide or silicon nitride.

Figure 2D:
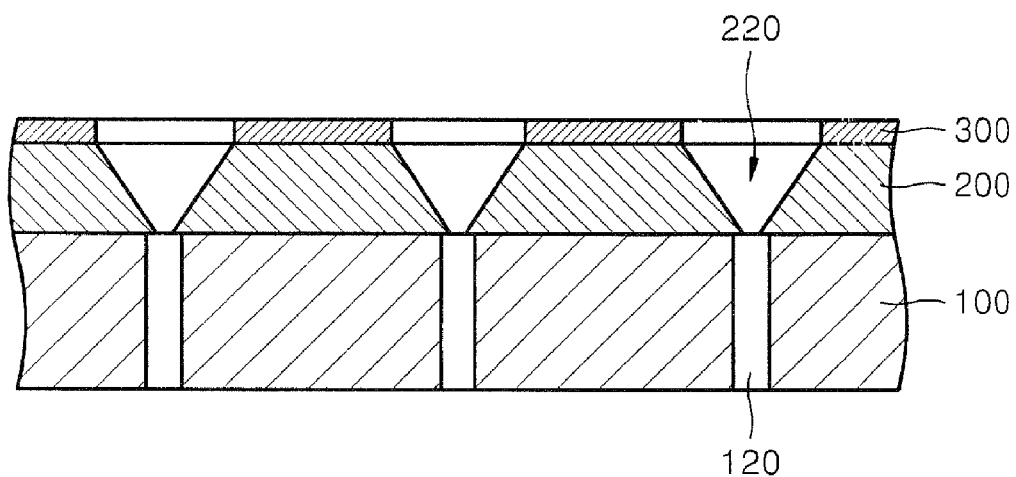

Referring to FIG. 2D, the first substrate 200 is etched by performing a wet etch process, using the mask layer 300 as an etch stop mask. Thus, the first substrate 200 is etched with an incline according to a lattice location of the silicon substrate having crystallographic orientation [100], thereby forming a funnel-shaped groove 220. In other words, the funnel-shaped groove 220 is formed due to the preferential wet etching characteristics of the different crystallographic faces of the [100] silicon substrate. The etching is performed until the lower portion of the groove 220 is connected to or in communication with the through-hole 120 of the second substrate 100. The lower portion of the groove 220 is preferably formed with suitable dimensions to allow a vacuum adsorption process to be easily performed, and to minimize the discharge of conductive powder through the lower portion of the groove 220.

Hereinafter, a method of forming a bump using the mold for forming a conductive bump as described above, and a method of bonding the bump to a semiconductor wafer will be explained in detail.

FIGS. 3A through 3G are cross-sectional views illustrating a method of forming a bump on a wafer, using the mold for forming a conductive bump according to an embodiment of the present invention.

Figure 3A:
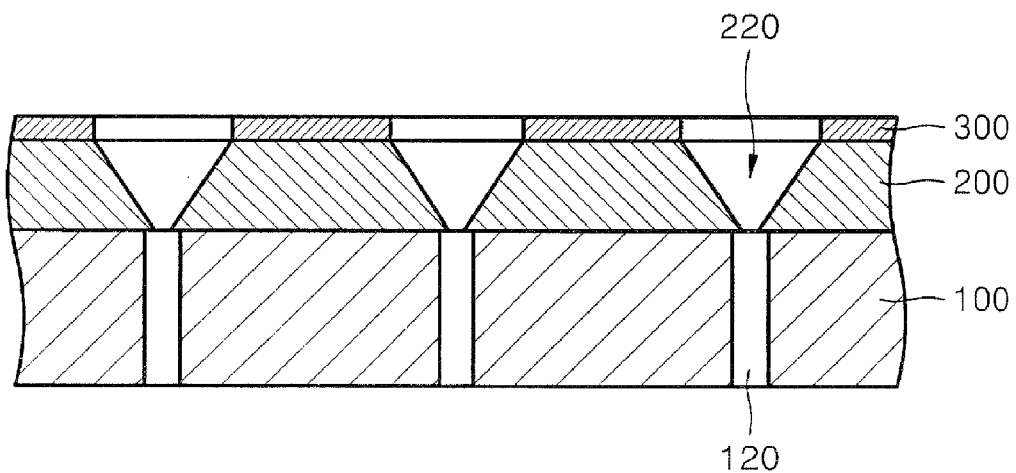
FIGS. 3A through 3G are sectional views illustrating a method of forming a bump on a wafer, using a mold for forming a conductive bump according to an embodiment of the present invention.

Referring to FIG. 3A, the mold for forming a conductive bump explained with reference to FIG. 1A is prepared. Thus, a description of the structure of the mold, and materials and sizes of respective components of the mold will be omitted. Although the mold of FIG. 1A will be utilized in this description, the mold of either FIG. 1B or 1C could also be utilized in the method for forming a bump on a wafer described below.

Figure 3B:
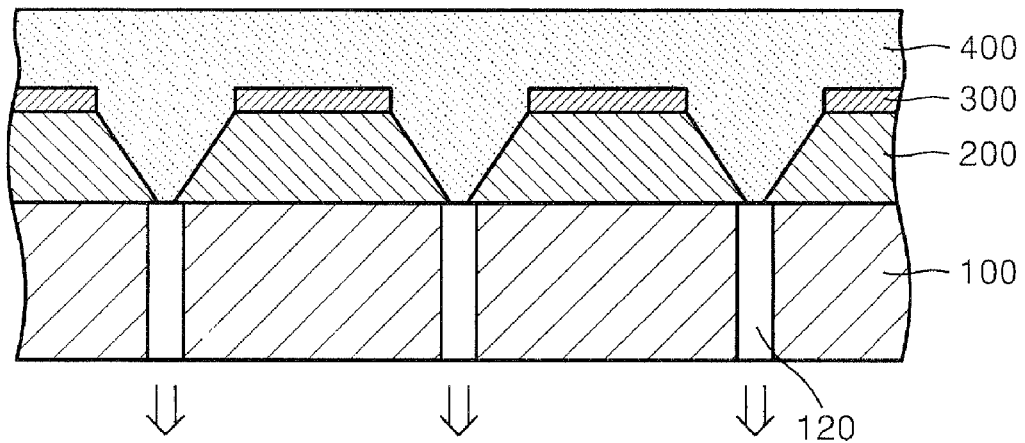

Referring to FIG. 3B, the groove 220 of the first substrate 200 and the mask layer 300 are coated with conductive powder 400. The conductive powder 400 is used for forming a conductive bump, and may be formed by mixing various metal powders. Therefore, the problems that the number of metal powder components is limited to two or less in the conventional electroplating method or the evaporation method can be solved. Further, since the conductive powder is a pure powder without flux, a problem of limitation of pitch caused by shorts or a bridging phenomenon between bumps in the printing method using a paste including flux can be solved.

In order to fill the groove 220 of the first substrate 200 with the conductive powder 400, vacuum adsorption is performed through the through-hole 120 of the second substrate 100. The vacuum adsorption process helps to ensure that the groove 220 is filled with the conductive powder 400, thereby providing for the formation of uniform sized conductive bumps.

Figure 3C:
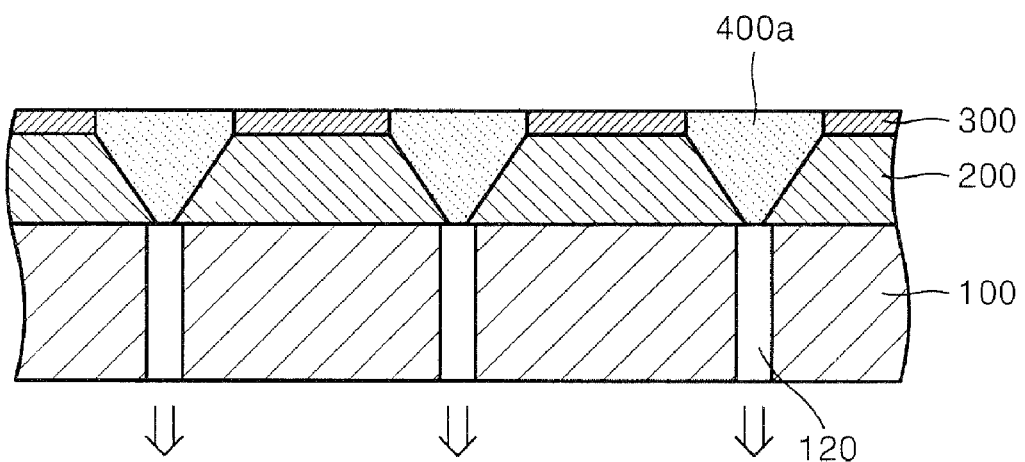

Referring to FIG. 3C, the conductive powder 400 coating the groove 220 and the mask layer 300 is removed except for the conductive powder 400 in the groove 220 of the first substrate 200. Conductive powder 400a remaining in the groove 220 will form a conductive bump as described below.

The removal of the rest of the conductive powder 400 may be performed using various methods. For example, a blade is used to remove the rest of the conductive powder 400. Alternatively, the rest of the conductive powder 400 may be removed using air or a brush because the conductive powder 400a in the groove may be stuck by the vacuum adsorption.

Figure 3D:
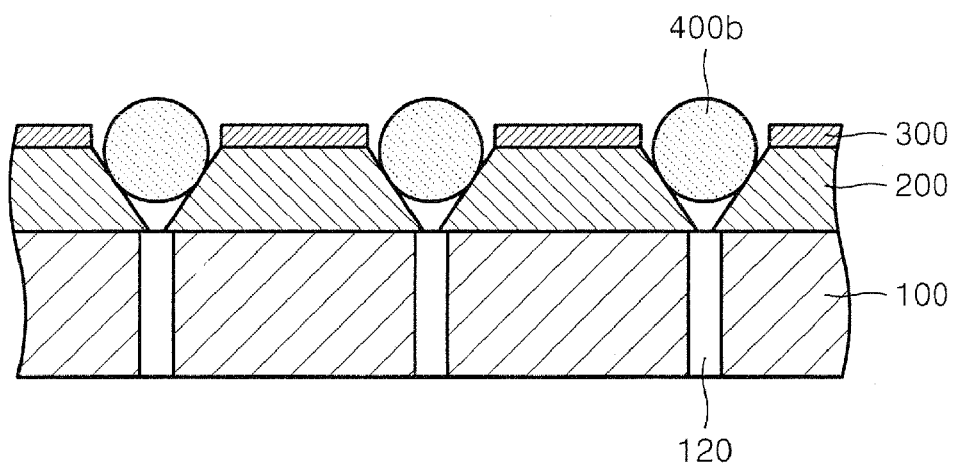

Referring to FIG. 3D, heat is applied to the conductive powder 400a remaining in the groove 220 of the first substrate 200. Consequently, the conductive powder 400a melts and is cooled, thereby forming a ball-shaped conductive bump 400b. After the conductive powder 400a is melted by heat to be changed to a liquid state, it is then changed to an alloy bump of a solid state during cooling. In other words, the melting and cooling process forms a conductive bump 400b that is an alloy of the different elements comprising the conductive powder 400a. The alloy bump does not bond well to the first substrate 200 because of low wetting with respect to the first substrate 200, and solidifies into a ball shape by its cohesive force. Thus, a ball-shaped conductive bump 400b is formed in the funnel-shaped groove 220 such that a portion of the conductive bump 400b contacts inside the groove 220, and the contact areas of the groove 220 and the conductive bump 400b are smaller than those occurring in grooves having other shapes. Further, the ball-shaped conductive bump 400b is formed somewhat in a self-aligned position with respect to the through-hole 120. Because of these reasons, the groove 220 of the first substrate 200 is preferably formed as a substantially funnel shape.

The melting and cooling processes may be performed in a state where the vacuum adsorption is stopped, that is, at atmospheric pressure. This is because the conductive bump 400b cannot have a ball shape if the vacuum adsorption is continuously applied during the melting and cooling processes, particularly, the cooling process.

Figure 3E:
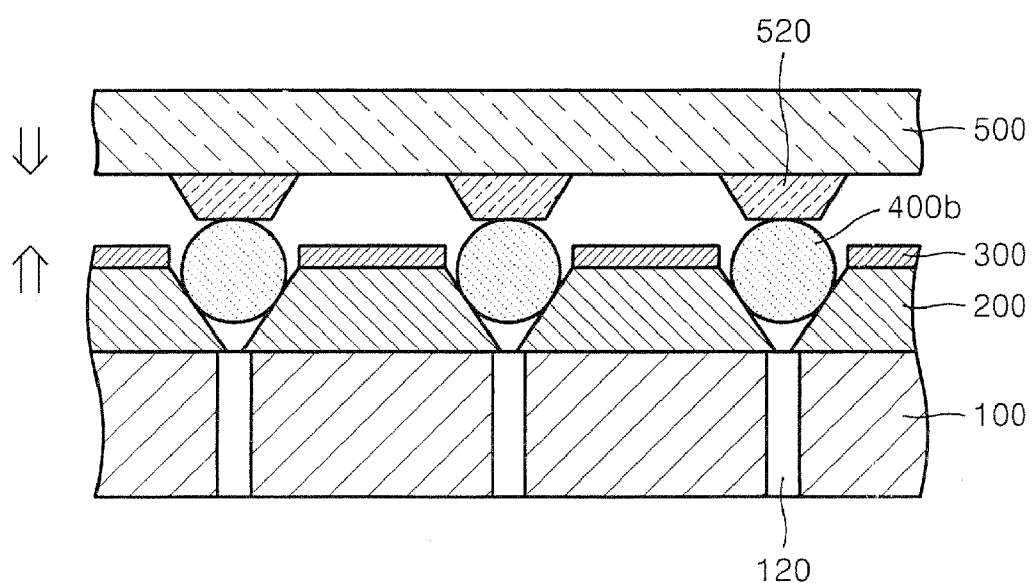

Referring to FIG. 3E, after the conductive bump 400b is formed, a semiconductor wafer 500 is bonded to the conductive bump 400b. Here, since a pad 520 of the semiconductor wafer 500 is aligned with the groove 220 of the first substrate 200 as described above, the pad 520 is also properly aligned with the conductive bump 400b.

On the other hand, vacuum adsorption may be maintained such that the conductive bump 400b is stuck in the groove 220 of the first substrate 200 until the bonding process of the semiconductor wafer 500 begins.

Figure 3F:
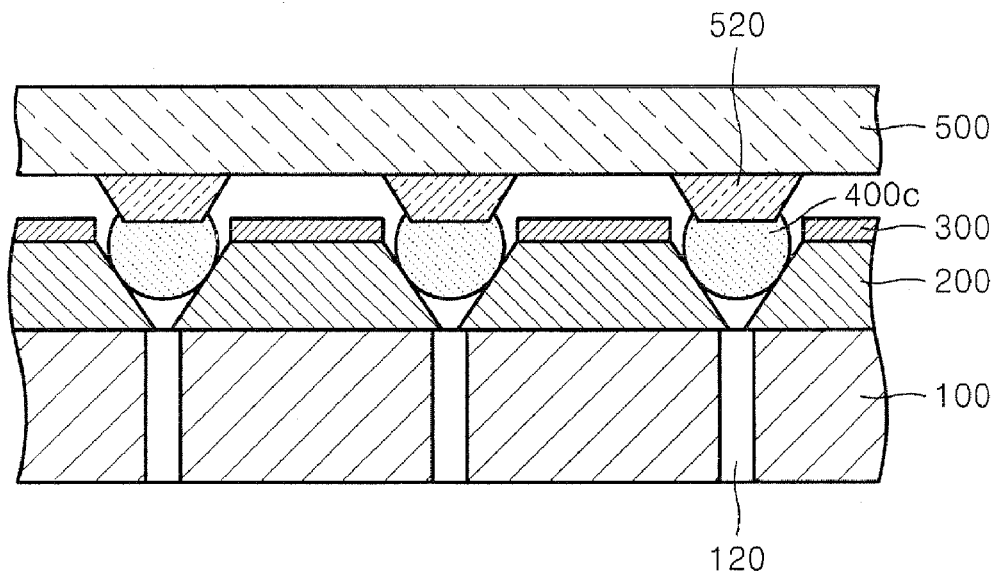

Referring to FIG. 3F, the conductive bump 400b is bonded to the pad 520 of the semiconductor wafer 500. The bonding is performed by removing foreign substances such as an oxide layer on the pad 520, and then, bonding the pad 520 and the conductive bump 400b, using flux or heating and compressing the semiconductor wafer along with a flux treatment in order to increase an adhesive force with the conductive bump 400b. Since the bonded conductive bump 400c has good adhesion with the pad 520 compared to the first substrate 200, it bonds well to the pad 520. After the bonding, the semiconductor wafer 500 and the mold are separated. Meanwhile, it is preferable to stop the vacuum adsorption during the bonding and separation processes in order to properly separate the conductive bump 400c from the first substrate 200.

Figure 3G:
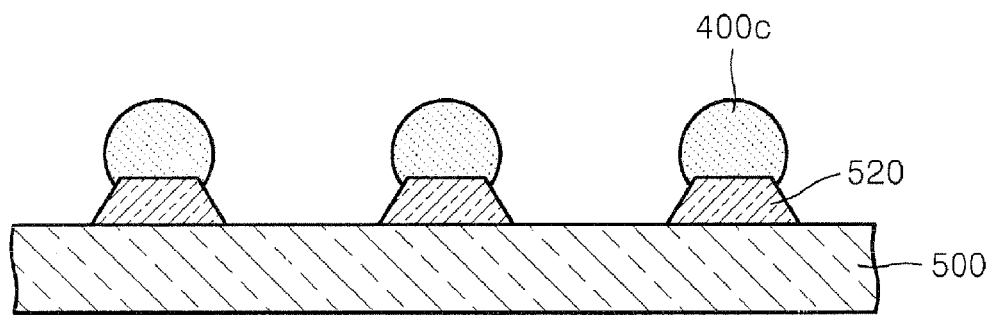

Referring to FIG. 3G, the conductive bump 400c is bonded to the pad 520 of the semiconductor wafer, which illustrates that a solder bump is formed.

The method of forming a bump on a wafer according to an embodiment of the present invention can be accomplished using the mold for forming the conductive bump explained with reference to any of FIGS. 1A through 1C. Various materials of conductive bumps can be easily formed on a semiconductor wafer by this method.

Figure 4:
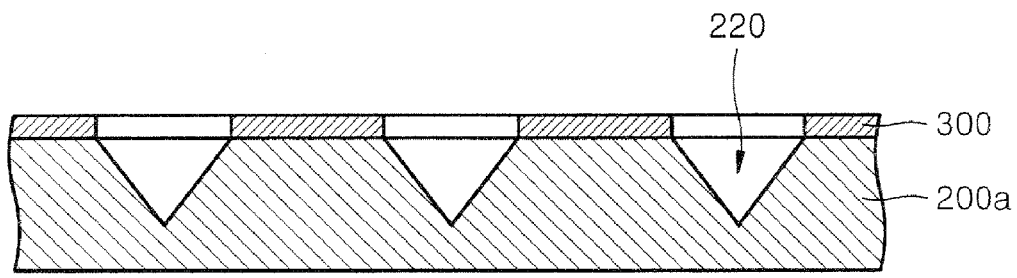
FIG. 4 is a sectional view illustrating a mold for forming a conductive bump used in the method of forming a bump on a wafer according to a fourth embodiment of the present invention.

FIG. 4 is a sectional view illustrating a mold for forming a conductive bump used in a method of forming a bump on a wafer according to a fourth embodiment of the present invention.

Referring to FIG. 4, the method of forming a bump on a wafer according to an embodiment of the present invention can be accomplished using a mold without a second substrate having a through-hole. However, since vacuum adsorption cannot be used during the method, the removal of a conductive powder is preferably performed using a blade.

Meanwhile, since the shape of the groove 220 of the first substrate 200a is not limited to a funnel shape, various shapes of the groove can be used.

As described above, the mold for forming a conductive bump according to an embodiment of the present invention overcomes the problems caused in the methods of forming a bump using an electroplating process, an evaporation process, and a printing method.

Further, various shapes of a mold for forming a conductive bump can be easily formed, and the methods of forming the mold can be easily performed.

Furthermore, since the method of forming a bump on a wafer using the mold according to an embodiment of the present invention uses the mold for forming a conductive bump, various materials of a conductive bump can be formed, and the bonding of the bump to the semiconductor wafer can be easily performed, resulting in high processing efficiency and high cost savings.

According to an aspect of the present invention, there is provided a mold for forming a conductive bump comprising: a first substrate having a groove; a second substrate disposed below the first substrate, and having a through-hole in communication with the groove; and a mask layer formed on the first substrate, and having an opening exposing the groove.

In some embodiments of the present invention, an adhesive layer may be formed between the first substrate and the second substrate so as to bond the first and second substrates and to function as a buffer layer. The groove of the first substrate may have a funnel shape. The funnel-shaped groove may be formed by wet-etching the first substrate, which may be formed of a silicon substrate having crystallographic orientation [100].

The second substrate may be formed of a photosensitive glass, and the through-hole of the second substrate may be formed using a photolithography process. Further, the mask layer may comprise silicon oxide or silicon nitride, and a pattern to form the groove of the first substrate may be formed on the mask layer. An opening of the pattern may be formed at a position corresponding to the position of a pad of a semiconductor wafer where a bump is to be formed.

According to another aspect of the present invention, there is provided a method of forming a mold for forming a conductive bump comprising: bonding a first substrate to a second substrate having a through-hole; forming a mask layer having a pattern on the first substrate; and etching the first substrate using the mask layer as an etch mask, so as to form a groove in communication with the through-hole.

In some embodiments of the present invention, the bonding of the first and second substrates may be performed by forming an adhesive layer between the first substrate and the second substrate, and the adhesive layer may function as a buffer layer. Further, the bonding of the first and second substrates may be accomplished by an anodic bonding or a thermal compression. Also, before forming the mask layer, the method may comprise performing a back-lap process, thereby polishing an upper surface of the first substrate to a predetermined thickness.

The second substrate may be formed of a photosensitive glass, and the through-hole may be formed using a photolithography process. The first substrate may be formed of a silicon substrate having crystallographic orientation [100], and the groove may be formed as a funnel shape by wet-etching the first substrate. The mask layer may be composed of silicon oxide or silicon nitride, and an opening of the pattern may be formed at a position corresponding to the position of a pad of a semiconductor wafer where a bump is to be formed.

According to another aspect of the present invention, there is provided a method of forming a bump on a wafer using a mold for forming a conductive bump, and the method comprises preparing a mold for forming a conductive bump, the mold having a groove; coating the upper surface of the mold with a conductive powder as a material for forming the bump; removing all the conductive powder except for the conductive powder in the groove; melting and cooling the conductive powder, so as to form a conductive bump; and bonding the conductive bump to a pad of a semiconductor wafer.

In some embodiments of the present invention, the mold for forming the conductive bump may comprise a first substrate having a groove to form a bump; and a mask layer used to form the groove. The mold for forming the conductive bump may further comprise a second substrate for vacuum adsorption formed below the first substrate, and having a through-hole in communication with the groove.

An adhesive layer may be formed between the first substrate and the second substrate, and the adhesive layer may function to bond the first and second substrates and may function as a buffer layer. The first substrate may be formed of a silicon substrate having crystallographic orientation [100], and the groove may be formed as a funnel shape by wet-etching the first substrate. The second substrate may be formed of a photosensitive glass, and the mask layer may comprise silicon oxide or silicon nitride.

Further, the coating of the powder may be performed along with vacuum adsorption through the through-hole of the second substrate. The removing of the conductive powder may be performed using a blade, air or a brush.

Meanwhile, the conductive bump formed by the melting and cooling processes may be formed to have a ball shape. In order to form the ball-shaped conductive bump, the melting and cooling processes may be performed after stopping the vacuum adsorption. Further, after forming the ball-shaped conductive bump and before bonding the pad, the conductive bump may be stuck in the groove by the vacuum adsorption. After bonding of the pad, the vacuum adsorption may be stopped and the semiconductor wafer and the mold for forming the conductive bump may be separated, so as to complete the formation of the semiconductor wafer having the bump formed thereon.

The bonding of the conductive bump to the pad may use flux, or may use flux along with heating of the semiconductor wafer. The flux may remove foreign substances including an oxide layer on an upper surface of the pad, and may provide an adhesive force on the conductive bump so as to bond the conductive bump to the pad.

The conductive powder may be prepared by mixing three metal components or more, and the conductive powder may not include flux. Thus, the conductive powder used in the coating may be in the state of pure powder not a paste state.

The mold for forming a conductive bump according to an embodiment of the present invention can be repeatedly used several times because the mold is not damaged, and due to a high precision of the mold, pitch is not limited. Further, the bump according to an embodiment of the present invention can be formed with various materials by using the mold and solving the problem of the limitation of the materials occurring in the conventional electroplating and evaporation methods. Further, the bump can be formed easily on a semiconductor wafer since conventional paste made of a mixture of conductive powder and flux is not necessary, and thus, the problems of pitch limitation due to electric shorts, contamination due to the use of flux, and cleaning can be solved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a bump on a wafer using a mold, the method comprising:

preparing a mold, the mold having a groove;

coating the upper surface of the mold with a conductive powder;

removing substantially all of the conductive powder except for the conductive powder in the groove;

melting and cooling the remaining conductive powder, so as to form a conductive bump; and bonding the conductive bump to a pad of a semiconductor wafer and removing said mold.

2. The method of claim 1, wherein the mold comprises:

a first substrate having a groove; and a mask layer used to form the groove.

3. The method of claim 2, wherein the mold comprises a second substrate for vacuum adsorption formed below the first substrate, and having a through-hole in communication with the groove.

4. The method of claim 3, wherein an adhesive layer is formed between the first substrate and the second substrate, the adhesive layer bonding the first and second substrates and functioning as a buffer layer.

5. The method of claim 3, wherein the first substrate is formed of a silicon substrate having crystallographic orientation [100], and the groove is formed as a funnel shape by wet-etching the first substrate.

6. The method of claim 3, wherein the second substrate is formed of a photosensitive glass, and the mask layer comprises one or more of silicon oxide and silicon nitride.

7. The method of claim 3, wherein the coating of the powder is performed along with vacuum adsorption through the through-hole of the second substrate.

8. The method of claim 7, wherein the removing of the conductive powder is performed using air or a brush.

9. The method of claim 7, wherein the conductive bump formed by the melting and cooling processes has a ball shape.

10. The method of claim 9, wherein the ball-shaped conductive bump is a solder bump.

11. The method of claim 9, wherein the melting and cooling processes to form the conductive bump are performed after stopping the vacuum adsorption.

12. The method of claim 11, wherein after forming the ball-shaped conductive bump and before bonding the pad, the conductive bump is held in the groove by the vacuum adsorption.

13. The method of claim 12, after the bonding of the pad, further comprising stopping the vacuum adsorption and separating the semiconductor wafer and the mold, so as to complete the formation of the semiconductor wafer having the bump formed thereon.

14. The method of claim 1, wherein the removing of the conductive powder is performed using a blade.

15. The method of claim 1, wherein the conductive bump formed by the melting and cooling processes has a ball shape.

16. The method of claim 1, wherein the bonding of the conductive bump to the pad comprises using flux, or using flux along with heating of the semiconductor wafer.

17. The method of claim 16, wherein the flux removes foreign substances including an oxide layer on an upper surface of the pad, and provides an adhesive force on the conductive bump so as to bond the conductive bump to the pad.

18. The method of claim 1, wherein the conductive powder comprises three or more metal components.

19. The method of claim 1, wherein the conductive powder does not include flux.

* * * * *